United States Patent
Agatani et al.

(10) Patent No.: US 9,577,153 B2
(45) Date of Patent: Feb. 21, 2017

(54) LIGHT EMISSION DEVICE AND ILLUMINATION DEVICE

(71) Applicant: SHARP KABUSHIKI KAISHA, Osaka-shi, Osaka (JP)

(72) Inventors: Makoto Agatani, Osaka (JP); Makoto Matsuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/376,578

(22) PCT Filed: Feb. 19, 2013

(86) PCT No.: PCT/JP2013/054045
§ 371 (c)(1),
(2) Date: Aug. 4, 2014

(87) PCT Pub. No.: WO2013/125539
PCT Pub. Date: Aug. 29, 2013

(65) Prior Publication Data
US 2015/0048409 A1    Feb. 19, 2015

(30) Foreign Application Priority Data
Feb. 20, 2012 (JP) ................. 2012-034517

(51) Int. Cl.
| | | |
|---|---|---|
| H01L 33/40 | (2010.01) | |
| H01L 33/62 | (2010.01) | |
| H01L 25/075 | (2006.01) | |

(52) U.S. Cl.
CPC ............... *H01L 33/40* (2013.01); *H01L 33/62* (2013.01); *H01L 25/0753* (2013.01); *H01L 2924/0002* (2013.01); *H01L 2933/0016* (2013.01)

(58) Field of Classification Search
CPC .......... H01L 33/20; H01L 33/60; H01L 33/62; H01L 33/54; H01L 33/44; H01L 25/0753
See application file for complete search history.

(56) References Cited

U.S. PATENT DOCUMENTS

| | | | |
|---|---|---|---|
| 7,888,697 B2 * | 2/2011 | Kawanobe et al. | 257/98 |
| 2011/0108875 A1 * | 5/2011 | Takenaka et al. | 257/98 |

(Continued)

FOREIGN PATENT DOCUMENTS

| | | | |
|---|---|---|---|
| JP | 5-243240 A | 9/1993 | |
| JP | 7-233496 A | 9/1995 | |

(Continued)

OTHER PUBLICATIONS

Japanese Office Action mailed Dec. 16, 2014 in JP application 2012-034517.

(Continued)

*Primary Examiner* — Latanya N Crawford
(74) *Attorney, Agent, or Firm* — Nixon & Vanderhye P.C.

(57) ABSTRACT

A light emission device includes: an insulating substrate; a light emitting section including a plurality of LED chips mounted on the insulating substrate; and land electrodes for supplying power to the LED chips. At least a surface of each of the land electrodes is made of a conductive material which is harder than Au and Ag and which has sulfurization resistance to such an extent that secures conduction of each land electrode when a current in a working current range is applied on the land electrode.

10 Claims, 3 Drawing Sheets

(56) References Cited

U.S. PATENT DOCUMENTS

| | | | |
|---|---|---|---|
| 2011/0116252 A1 | 5/2011 | Agatani et al. | |
| 2011/0180817 A1 | 7/2011 | Ishizaki et al. | |
| 2011/0293926 A1* | 12/2011 | Kobayashi et al. | 428/332 |
| 2011/0299268 A1 | 12/2011 | Ishizaki et al. | |
| 2012/0313131 A1* | 12/2012 | Oda | H01L 21/6835 257/98 |

FOREIGN PATENT DOCUMENTS

| | | |
|---|---|---|
| JP | 2004-047247 | 2/2004 |
| JP | 2004-183077 | 7/2004 |
| JP | 2007234637 | 9/2007 |
| JP | 2008010591 | 1/2008 |
| JP | 2008-251663 A | 10/2008 |
| JP | 3164276 | 10/2010 |
| JP | 2010-251775 A | 11/2010 |
| JP | 2011-108744 A | 6/2011 |
| JP | 2011-151268 A | 8/2011 |
| JP | 2011-258611 A | 12/2011 |
| JP | 2012-009886 A | 1/2012 |
| JP | 2012-23078 A | 2/2012 |
| JP | 2012-28130 A | 2/2012 |
| JP | WO 2012165007 A1 * | 12/2012 ........... H05K 1/0274 |
| JP | EP 2717338 A1 * | 4/2014 ........... H05K 1/0274 |
| WO | WO 2010/071182 A1 | 6/2010 |

OTHER PUBLICATIONS

International Search Report for PCT/JP2013/054045, mailed Mar. 19, 2013.
Written Opinion of the International Searching Authority for PCT/JP2013/054045, mailed Mar. 19, 2013.
Japanese Office Action mailed Jun. 16, 2015 in Japanese Patent Application 2012-034517.
Japanese Office Action mailed Oct. 4, 2016 in JP application 2015-246758.

* cited by examiner

LIGHT EMISSION DEVICE AND ILLUMINATION DEVICE

This application is the U.S. national phase of International Application No. PCT/JP2013/054045, filed 19 Feb. 2013, which designated the U.S. and claims priority to JP Application No. 2012-034517, filed 20 Feb. 2012, the entire contents of each of which are hereby incorporated by reference.

TECHNICAL FIELD

The present invention relates to a light emission device in which a light emitting section including semiconductor light emitting elements such as LEDs and electrodes for electrical connection with the semiconductor emitting elements are provided on a substrate.

BACKGROUND ART

Recently, there have been prevailing illumination devices whose light sources are semiconductor light emitting elements which have longer lives and which consume a smaller amount of power, such as LEDs. Such illumination devices include an illumination device using a light emission device in which a plurality of LED chips are mounted on an insulating substrate with a high heat-radiating property, such as a ceramic substrate.

Such a light emission device includes a positive electrode and a negative electrode each for supplying power to LED chips. Normally, these electrodes are provided on a substrate so as to be near a light emitting section where LED chips are mounted, in order to allow electric connection with the outside. Conventional examples of materials for such electrodes include Au and AgPt. For example, Patent Literature 1 discloses a light emission device in which such electrodes made of Au are formed on a substrate by plating.

Formation of electrodes by plating requires high costs since it requires a large facility and a large number of steps. In contrast, formation of electrodes by printing is easy to introduce since it requires a smaller facility and a smaller number of steps compared to the formation of electrodes by plating. For this reason, the formation of electrodes by printing is now substituting for the formation of electrodes by plating.

Conventionally, connection between electrodes of a light emission device and external wirings has been made normally by soldering. On the other hand, recently, use of connectors etc. for connection allows easily making electric connection between electrodes of a light emission device and external wirings. A main body of such a connector has a structure which exposes a light emitting section and covers a part of a substrate which part surrounds the light emitting section. The main body has plate-spring like terminals which touch electrodes of the light emission device.

CITATION LIST

Patent Literatures

[Patent Literature 1]

Japanese Utility Model Application Publication "Registered Utility Model No. 3164276 (published on Nov. 18, 2010)"

SUMMARY OF INVENTION

Technical Problem

In a case where an illumination device including the above light emission device is used in an environment with much vibration, when the electrodes of the light emission device are connected with external wirings via the connector, the electrodes of the light emission device and terminals of the connector rub against each other due to vibration. In a case where the electrodes of the light emission device are made of Au with low hardness, the electrodes are likely to suffer damages such as flaws, cracks, and peeling due to rubbing between the electrodes and the terminals of the connector. In a case where the electrodes of the light emission device are formed by plating, the electrodes have a tight structure and so may suffer only a small degree of damages, whereas in a case where the electrodes of the light emission device are formed by printing, the electrodes have a sparse structure and so suffer a great degree of damages. Such a problem is also found in a case where the electrodes are made of AgPt. Besides, since Au is expensive, it is not suitable as a material for a thick electrode in terms of costs.

Furthermore, the electrodes made of AgPt have a problem that such electrodes are less corrosive-resistant compared with electrodes made of Au which is hardly sulfurized, since AgPt contains Ag which is easily sulfurized. Consequently, if a surface of the electrode made of AgPt reacts with a sulfur component gas contained in the air, a sulfide is generated, whereby the electrode is deteriorated. This phenomenon is likely to occur particularly when the light emission device is used in a place where a gas containing a sulfur component is likely to be generated, such as roads with heavy traffic and their neighbors, cattle farmers, hot springs, and mines.

As described above, Au is well corrosive-resistant, but has insufficient strength. On the other hand, AgPt does not have satisfactory properties in practical use both in terms of corrosion resistance and strength. Consequently, use of Au or AgPt as a material for electrodes raises a problem of decrease in reliability of a light emission device.

The present invention was made in view of the foregoing problem. An object of the present invention is to provide a light emission device with high reliability by improving corrosion resistance and strength of electrodes.

Solution to Problem

A light emission device of the present invention includes: an insulating substrate; a semiconductor light emitting element mounted on the insulating substrate; and electrodes on the insulating substrate, the electrodes being for supplying power to the semiconductor light emitting element, a part of each of the electrodes which part includes at least a surface of said each electrode is made of a conductive material which is harder than Au and Ag and which has sulfurization resistance to such an extent that secures conduction of said each electrode when a current in a working current range is applied on said each electrode.

An illumination device of the present invention includes the aforementioned light emission device as a light source.

Advantageous Effects of Invention

The light emission device of the present invention configured as above can have improved corrosion resistance and strength of electrodes. Therefore, use of the present invention provides a light emission device with high reliability.

BRIEF DESCRIPTION OF DRAWINGS (a) of FIG. 1 is a plan view illustrating a configuration of a light emission device in accordance with one embodiment of the present invention. (b) of FIG. 1 is a cross sectional view taken along the line A-A of (a) of FIG. 1.

DESCRIPTION OF EMBODIMENTS

First Embodiment

The following description will discuss an embodiment of the present invention with reference to FIGS. 1 to 5.
[Entire Configuration of Light Emission Device]

Figure 1:
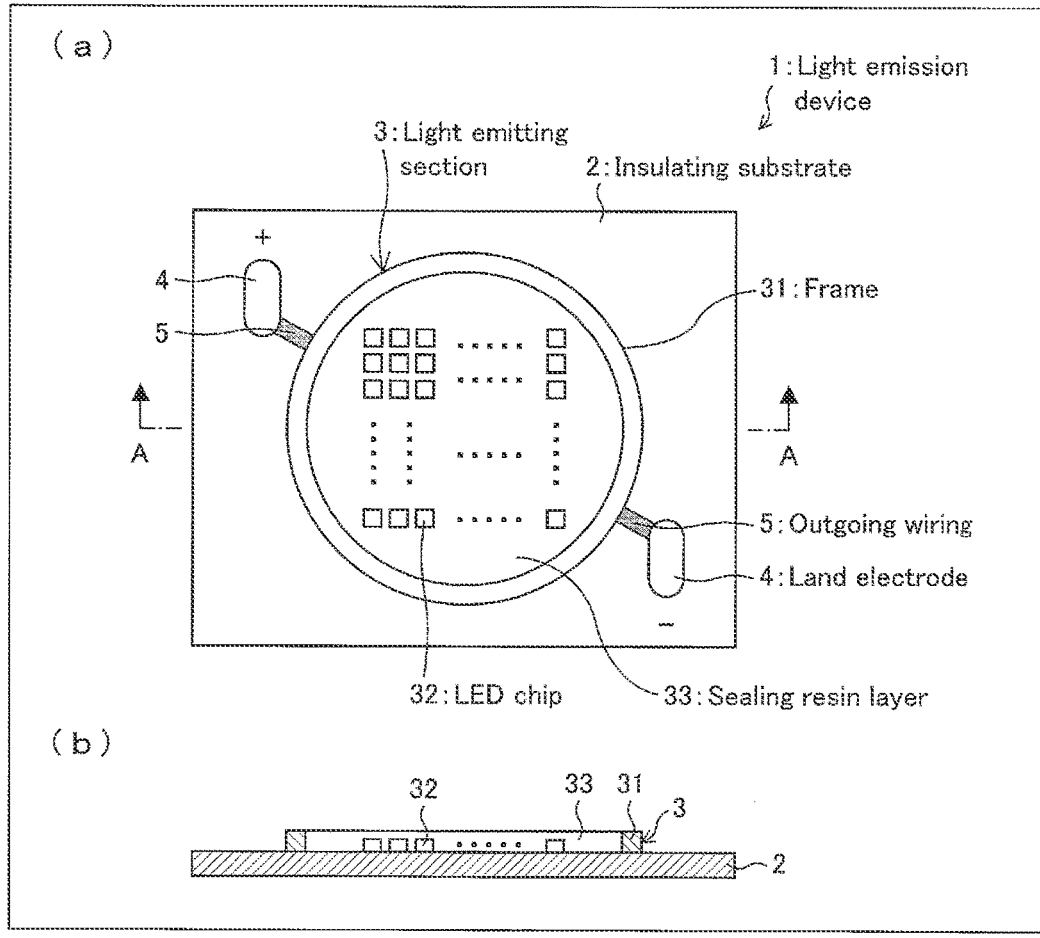

(a) of FIG. 1 is a plan view illustrating a configuration of a light emission device 1 in accordance with the present embodiment. (a) of FIG. 1 is a cross sectional view taken along the line A-A of (b) of FIG. 1.

As illustrated in (a) of FIG. 1 and (b) of FIG. 1, the light emission device 1 includes an insulating substrate 2, a light emitting section 3, land electrodes 4, and outgoing wirings 5.

The insulating substrate 2 has a quadrangular shape and is made of an insulating material. The material for the insulating substrate 2 is not limited as long as it is insulating, and is preferably a white ceramic substrate in particular. The white ceramic substrate is suitable as a substrate on which the light emitting section 3 is formed, since the white ceramic substrate has small thermal expansion, high thermal conductivity, and high light reflectance.

A whole of the insulating substrate 2 has an insulating property. Alternatively, in the insulating substrate 2, as long as regions where the light emitting section 3 and the land electrodes 4 are to be formed are insulating, regions other than those regions may be non-insulating. When later-mentioned LED chips 32 are mounted on the insulating substrate 2 via an insulating die-bonding material, it is possible to secure insulation between the LED chips 32 and a surface of the insulating substrate 2. In this case, regions where the LED chips 32 are to be mounted do not necessarily have an insulating property. However, since the land electrodes 4 are directly formed on the insulating substrate 2, at least regions where the land electrodes 4 are to be formed are required to have an insulating property. Furthermore, in a case where the LED chips 32 are mounted on the insulating substrate 2 via a non-insulating die-bonding material, the regions where the LED chips 32 are to be formed are required to have an insulating property, too. In this case, it is preferable that a relatively large region of the insulating substrate 2, e.g. a whole of a surface of the insulating substrate 2 on which surface the LED chips 32 are to be mounted and the land electrodes 4 are to be formed, has an insulating property. This allows forming the insulating substrate 2 with low costs.

A central portion of the top surface of the insulating substrate 2 has the light emitting section 3. A region surrounding the light emitting section 3 on the upper surface of the insulating substrate 2 has two (a pair of) land electrodes 4 (electrodes) and two outgoing wirings 5.

The land electrodes 4 are electrodes for supplying power to the LED chips 32 (mentioned later), and are positioned to face each other with the light emitting section 3 therebetween. One of the two land electrodes 4 is a plus electrode (positive electrode) and the other is a minus electrode (negative electrode). The land electrodes 4 are each shaped to be oval, but are not limited to this shape. The number of the land electrodes 4 is not limited to two, and a plurality of (plural pairs of) the land electrodes 4 may be provided in accordance with connection configuration of the LED chips 32, a purpose as a spare etc. Furthermore, as mentioned later, the land electrodes 4 are preferably formed by printing, but all of the land electrodes 4 are not necessarily formed by printing. For example, in a case where the light emission device 1 has a pair of normally used land electrodes 4 and a pair of spare land electrodes 4, at least the pair of normally used land electrodes 4 may be formed by printing.

The outgoing wirings 5 are wirings which connect the LED chips 32 with the land electrodes 4. For this purpose, one end of each of the outgoing wirings 5 is connected with a later-mentioned wiring pattern inside the light emitting section 3, and the other end is connected with a corresponding one of the land electrodes 4.
[Configuration of Light Emitting Section]

Figure 2:
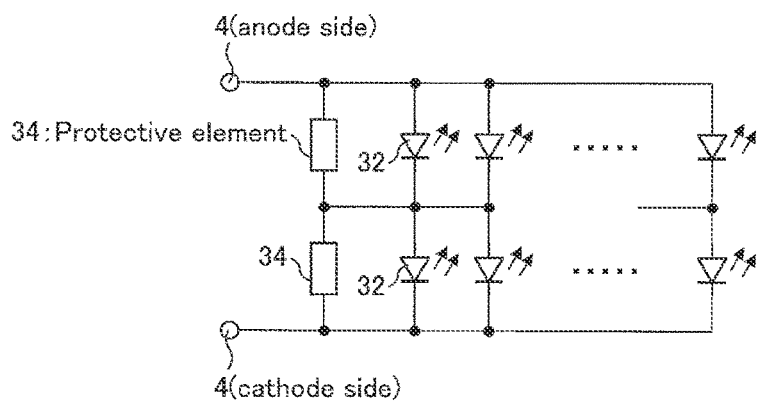
FIG. 2 is a circuit diagram illustrating a connection configuration of LED chips mounted on the light emission device.

FIG. 2 is a circuit diagram illustrating the connection configuration of the LED chips 32.

The light emitting section 3 includes a frame 31, the LED chips 32, and a sealing resin layer 33.

The frame 31 is made of resin and has a wall-like shape. The frame 31 defines a light emitting region of the light emitting section 3. The frame 31 has a circular shape. However, the shape of the frame 31 is not limited and may be other shape such as a quadrangle.

The LED chips 32 (semiconductor light emitting elements) are mounted inside the frame 31 on the insulating substrate 2. The LED chips 32 are connected with each other via a wiring pattern (not illustrated) on the insulating substrate 2.

As illustrated in FIG. 2, the LED chips 32 form LED chip columns each consisting of two LED chips 32 connected with each other in series. Points where the two LED chips 32 are connected with each other are connected with each other. An anode of one LED chip 32 of each LED chip column is connected with the land electrode 4 (anode side, plus electrode), and a cathode of the other LED chip 32 is connected with the land electrode 4 (cathode side, minus electrode). Furthermore, two protective elements 34 connected with each other in series are connected with the LED chip columns in parallel so that the two protective elements 34 are common among the LED chip columns. The protective elements 34 are each made of a resistor etc., and are mounted, although not illustrated, inside the frame 31 on the insulating substrate 2, similarly with the LED chips 32.

The connection configuration of the LED chips 32 is not limited to the example illustrated in FIG. 2, and various kinds of connection configurations may be employed according to specifications.

The LED chips 32 are LED chips with a color or colors required for obtaining a desired emission color. In a case where a fluorescent material is dispersed in the sealing resin layer 33, a desired emission color may be obtained by mixing emission light from the LED chips with light from the fluorescent material excited by the emission light. In a case where the fluorescent material is not dispersed in the sealing resin layer 33, a desired emission color may be obtained as an emission color of LED chips alone, or may be obtained by mixing emission colors from LED chips emitting light in different emission colors.

The sealing resin layer 33 seals the LED chips 32, and is formed by filling an inside of the frame 31 on the insulating substrate 2 with a resin material and curing the resin material. The resin material is required to have transparency. An example of the resin material is silicone resin. The fluorescent material is dispersed in the sealing resin layer 33 as above if necessary.

[Configurations of Land Electrodes and Outgoing Wirings]

Figure 3:
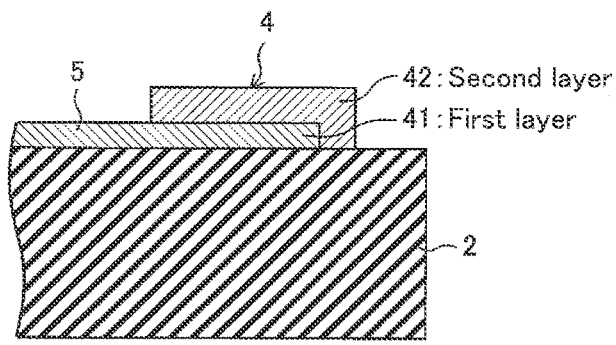
FIG. 3 is a longitudinal cross sectional view illustrating an enlarged portion where land electrodes and outgoing wirings are formed in the light emission device.
Figure 4:
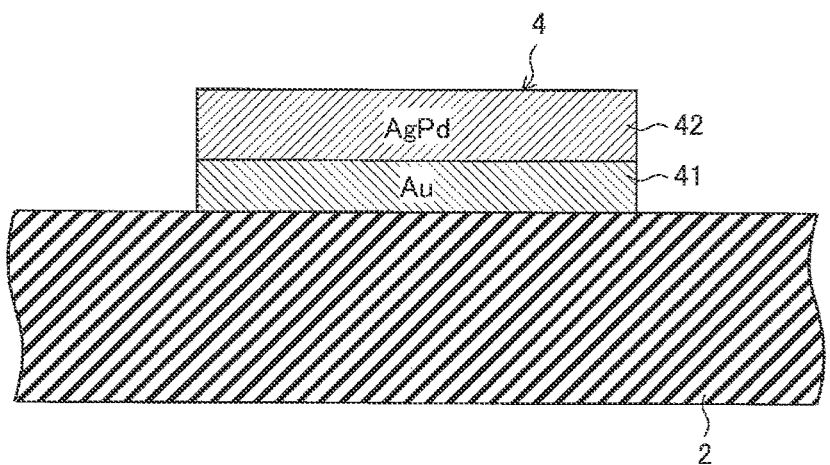
FIG. 4 is a longitudinal cross sectional view illustrating a structure of the land electrode.
Figure 5:
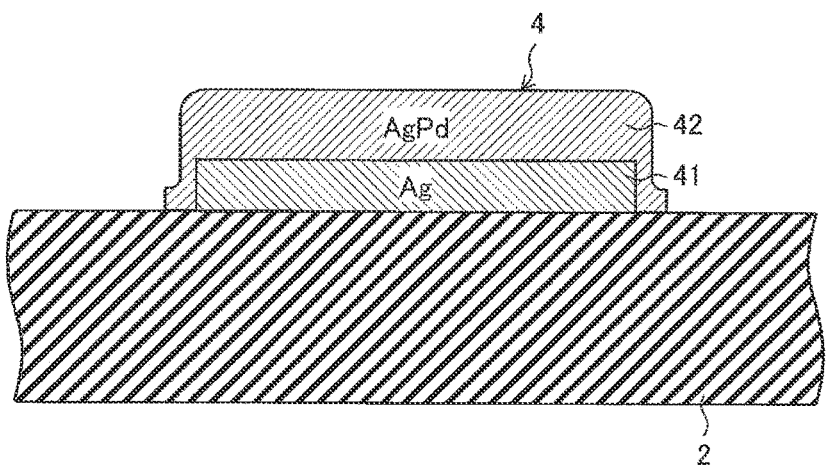
FIG. 5 is a longitudinal cross sectional view illustrating an alternative structure of the land electrode.

FIG. 3 is a longitudinal cross sectional view illustrating an enlarged portion where the land electrodes 4 and the outgoing wirings 5 are formed in the light emission device 1. FIG. 4 is a longitudinal cross sectional view illustrating a structure of the land electrode 4. FIG. 5 is a longitudinal cross sectional view illustrating an alternative structure of the land electrode 4.

As illustrated in FIG. 3, the land electrodes 4 are each constituted by a first layer 41 (underlying layer) on the insulating substrate 2 and a second layer 42 (surface layer) on the first layer 41.

The first layer 41 is integrally formed with the outgoing wiring 5. The first layer 41 is formed simultaneously with the outgoing wiring 5 by printing (screen printing etc.). It is preferable that the first layer 41 and the outgoing wiring 5 are made of a conductive material with low electric resistance in order to secure good conductivity, and are made of, for example, Au or Ag.

The second layer 42 is made of a conductive material which is harder (than Au and Ag) and has higher corrosion resistance (sulfurization resistance) than the first layer 41. Specifically, the second layer 42 is made of a conductive material having higher hardness than Au and Ag and having sulfurization resistance to such an extent that secures conduction of the land electrodes 4 when a current in a working current range is applied on the land electrodes 4. Such a conductive material preferably has hardness of 100 Hv or more in relation to Vickers hardness of 22 Hv of Au and Vickers hardness of 26 Hv of Ag. This allows preventing damages due to vibration of a portion of the second layer 42 which portion touches the terminals of the aforementioned connector.

A preferable example of such a conductive material is AgPd (silver-palladium alloy). In general, AgPd is used as a wiring material. Since AgPd is hard and gets harder as AgPd contains a more amount of Pd, AgPd is resistive to impact. A content of Pd in AgPd is preferably 30% or more but 80% or less by weight of AgPd.

In a case where the content of Pd is 30%, a sulfide film of approximately 100 Å in thickness is formed on surfaces of the land electrodes 4. The sulfide film having such a thickness undergoes electrical breakdown due to a current in a current range (approximately 10 mA to 1 A) normally used by the land electrodes 4, so that the sulfide film becomes electrically conductive. However, there is a possibility that such a sulfide film does not undergo electrical breakdown and becomes a resistor when a current in a micro current range (approximately 1 μA to 10 mA) passes through the sulfide film. On the other hand, in a case where the content of Pd is 40% or more, the sulfide film formed on the surfaces of the land electrodes 4 is a thin film of 10 Å or less in thickness, so that the sulfide film undergoes electrical breakdown and becomes electrically conductive even when a current in the micro current range passes through the sulfide film. Accordingly, sulfurization in such a degree as to secure conduction of the land electrodes 4 when a current in a normally working current range is applied on the land electrodes 4 does not hinder practical use. Therefore, the content of Pd is preferably 30% or more at which the sulfide film has a thickness of approximately 100 Å or less.

AgPd is a material used also for a resistor, and is more resistive than Au and Ag. Furthermore, Pd is a rare metal and so is expensive. Accordingly, it is better as the content of Pd in AgPd is smaller. Besides, AgPd containing 40% by weight of Pd exhibits Vickers hardness of 102 Hv. Therefore, the content of Pd in AgPd is preferably 30% or more by weight but 40% or less by weight in terms of hardness, sulfurization resistance, and cost-effectiveness, and is most preferably 40% by weight. The maximum content of Pd in AgPd is preferably 80% or less by weight in practical use, in consideration of electric resistance value and costs.

Another examples of the conductive material for the second layer 42 include AgZn (silver-zinc alloy), AgSn (silver-tin alloy), AgCu (silver-copper alloy), ITO (indium tin oxide), $SnO_2$ (tin oxide), and BiSn (bismuth-tin alloy). These materials meet the above conditions in terms of hardness and corrosion resistance. Furthermore, since these materials are provided in the form of paste, they can be easily used in screen printing. In particular, formation of an electrode from ITO is normally made by a photo process, but the formation may be made by screen-printing ITO paste and sintering the printed ITO paste. Accordingly, it is possible to form an electrode from ITO without using a large facility necessary for the photo process, such as a film-forming device and an etching device.

A still another example of the conductive material is a metal nanoparticle paste which utilizes a low-temperature sintering property of nano-sized metal particles. A conventional high-temperature sintering conductive paste has a sintering temperature of several hundred degrees, whereas the metal nanoparticle paste has an advantage that it can be sintered at a low temperature of 100° C. to 250° C. Furthermore, the metal nanoparticle paste has high dimensional accuracy and is easy to be formed at a side surface, so that corner-shape-caused disconnection and unformed portion formation etc. of the conductive material at a side surface can be reduced. Furthermore, since the metal nanoparticle paste has a particle size of several nanometer to several ten nanometer, the metal nanoparticle paste forms a dense layer, and so is suitable for blocking a sulfur component gas contained in the air.

Next, the following description will discuss a specific structure of the land electrode 4.

In a structure illustrated in FIG. 4, the first layer 41 is made of Au, and the second layer 42 is made of AgPd (40% by weight of Pd). Furthermore, the first layer 41 and the second layer 42 are each formed to have a thickness of 2 μm or more but 8 μm or less, more preferably 3 μm or more but 8 μm or less.

Since the first layer 41 is made of Au with low electric resistance and high corrosion resistance, this structure allows the land electrode 4 to have higher electric conductivity and higher corrosion resistance. Furthermore, since the second layer 42 is made of AgPd with high hardness and high corrosion resistance, this structure allows the land electrode 4 to have higher surface hardness and higher corrosion resistance. Furthermore, although the second layer 42 is made of AgPd with high electric resistance, the first layer 41 is made of Au with low electric resistance, so that it is possible to prevent the land electrode 4 from having high electric resistance as a whole.

In particular, in a case where the second layer 42 is formed by printing, the second layer 42 has a sparse structure. Accordingly, by forming the second layer 42 to have a thickness of 2 μm or more, more preferably 3 μm or more, it is possible to prevent a portion of the second layer 42 which portion is to be connected with a terminal of a connector from being damaged due to vibration. Furthermore, since a current flows in a thickness direction of the second layer 42, by forming the second layer 42 to have a thickness of 8 μm or less, it is possible to suppress power loss at the land electrode 4 to such an extent that does not hinder practical use.

On the other hand, in a structure illustrated in FIG. 5, the first layer 41 is made of Ag, and the second layer 42 is made of AgPd (40% by weight of Pd). Furthermore, the first layer 41 and the second layer 42 are each formed to have a thickness of 2 μm or more but 8 μm or less, more preferably 3 μm or more but 8 μm or less, similarly with the structure illustrated in FIG. 4.

Since the first layer 41 is made of Ag with low electric resistance and low corrosion resistance, this structure allows the land electrode 4 to have higher electric conductivity. Furthermore, since the second layer 42 is made of AgPd with high hardness and high corrosion resistance, this structure allows the land electrode 4 to have higher surface hardness and higher corrosion resistance. Furthermore, although the second layer 42 is made of AgPd with high electric resistance, the first layer 41 is made of Ag with low electric resistance, so that it is possible to prevent the land electrode 4 from having high electric resistance as a whole.

In the structure illustrated in FIG. 5, the first layer 41 is made of Ag, so that an exposed portion at a side surface of the first layer 41 is likely to be sulfurized. In order to deal with this, the exposed portion is covered with AgPd which forms the second layer 42. This shields the first layer 41 from the outside air, so that it is possible to prevent sulfurization of the first layer 41. Consequently, it is possible to improve corrosion resistance of the land electrode 4 as a whole.

In this structure, the outgoing wiring 5, which is made of the same material as the first layer 41 and is integrally formed with the first layer 41, is covered with AgPd to be shielded from the outside air, similarly with the first layer 41.

[Formation of Land Electrode]

Next, the following description will discuss a procedure for forming the land electrode 4.

Initially, a conductive material in a paste form is put on a screen having printing patterns for the land electrodes 4 and the outgoing wirings 5, and the conductive material is pressed by a squeegee and extruded to a space below the screen, so that the conductive material is applied and printed on the insulating substrate 2. Thereafter, the conductive material is sintered for a predetermined time.

Next, the conductive material printed on the insulating substrate 2 is sintered at a predetermined temperature for a predetermined time, so that the conductive material is solidified. The temperature and the time for sintering are set appropriately according to the conductive material. Thus, the first layer 41 is formed.

A conductive material is printed on the second layer 42 by using a screen having a printing pattern for the land electrodes 4 similarly with above, and the conductive material is sintered similarly, so that the second layer 42 is formed.

As described above, formation of the land electrodes 4 by printing does not require a large facility compared with formation of electrodes by plating, and therefore is relatively easy to introduce.

[Effect Yielded by Light Emission Device]

As described above, in the light emission device 1, at least a part of the land electrode 4 which part includes a surface of the land electrode 4 is made of a conductive material which is harder than Au and Ag and which has sulfurization resistance to such an extent that secures conduction of the land electrode 4 when a current in a working current range is applied on the land electrode 4. Consequently, even when the land electrode 4 vibrates while the land electrode 4 touches the terminal of the connector to maintain electrical connection between the land electrode 4 and the terminal, the land electrode 4 is less likely to be damaged compared to a conventional electrode made of Au or Ag. In particular, when Vickers hardness of the electrode material is 100 Hv or more, the land electrode 4 is hardly damaged. Furthermore, since the land electrode 4 is made of a conductive material which has sulfurization resistance to such an extent that secures conduction of the land electrode 4 when a current in a working current range is applied on the land electrode 4, formation of a sulfide film on the surface of the land electrode 4 due to a sulfur component gas does not cause an inconvenience that the land electrode 4 becomes electrically non-conductive. As described above, the land electrode 4 has higher strength and higher corrosion resistance than a conventional electrode, so that it is possible to improve reliability of the light emission device 1.

The land electrode 4 is formed by printing. Accordingly, the land electrode 4 can be formed without a large facility. Furthermore, in a case where the land electrode 4 is obtained by forming a metal layer on a whole or a large area of the surface of the insulating substrate 2 and thereafter removing most of the metal layer to leave only a small area serving as the land electrode 4, employment of printing allows easily obtaining the land electrode 4. This is particularly effective in a case of forming the land electrode 4 with a small area on the insulating substrate 2 with a large area. Furthermore, since the land electrode 4 formed by printing has a sparse structure, when AgPd is used as the conductive material for the land electrode 4, an amount of Pd to be used can be reduced.

The land electrode 4 includes the first layer 41 and the second layer 42. Consequently, as illustrated in FIGS. 4 and 5 for example, the first layer 41 can be made of Au or Ag which has low electric resistance, and the second layer 42 can be made of AgPd having high hardness and high corrosion resistance. AgPd used here contains at least 40% by weight of Pd in order to prevent sulfurization. This allows suppressing electric resistance of the land electrode 4 as a whole and reducing a used amount of Pd which is a rare metal. As described above, by forming the land electrode 4 including two layers, it is possible to adjust electric resistance of the land electrode 4 as a whole and amounts of conductive materials used in respective layers.

Since Pd is a general material used also as a material for a resistor, there is no problem in reliability of Pd. Accordingly, it is unnecessary to make a test for evaluating reliability of the land electrode 4 made of AgPd.

Furthermore, it is preferable that the second layer 42 has a thickness of 2 µm or more but 8 µm or less. This allows the land electrode 4 to have at least a mechanical strength that is minimally required to prevent the land electrode 4 from being damaged, and allows suppressing power loss of the land electrode 4 due to high electric resistance, to such an extent that will not hinder practical use.

In the present embodiment, a description was made above as to an example in which the land electrode 4 includes the first layer 41 and the second layer 42. Alternatively, the land electrode 4 may be a single-layered land electrode. In this case, the land electrode 4 includes the second layer 42 as a single layer.

In the present embodiment, a description was made above as to a case where the land electrode 4 is formed by printing. Alternatively, the land electrode 4 may be formed by plating. However, since formation of an electrode by plating requires a large facility as described above, it is preferable to form the land electrode 4 by printing in terms of costs.

In the light emission device 1 in accordance with the present embodiment, the land electrodes 4 and the LED chips 32 are formed on the same surface of the insulating substrate 2. Alternatively, the land electrodes 4 may be formed on a surface of the insulating substrate 2 which surface is opposite to a surface (front surface) where the LED chips 32 are mounted, in other words, the land electrodes 4 may be formed on a rear surface of the insulating substrate 2. In this configuration, a through-hole etc. in which a metal is formed may be provided so as to penetrate the insulating substrate 2, so that a power is supplied from the land electrodes 4 to the LED chips 32 via the through-hole. Furthermore, in this configuration, a connector is provided at the rear surface of the insulating substrate 2, so that terminals of the connector touch the land electrodes.

Needless to say, in addition to the land electrodes 4 in touch with the terminals of the connector, a land electrode for solder connection may be provided on the insulating substrate 2. In this configuration, both of connection via the connector and solder connection can be used.

Second Embodiment

Figure 6:
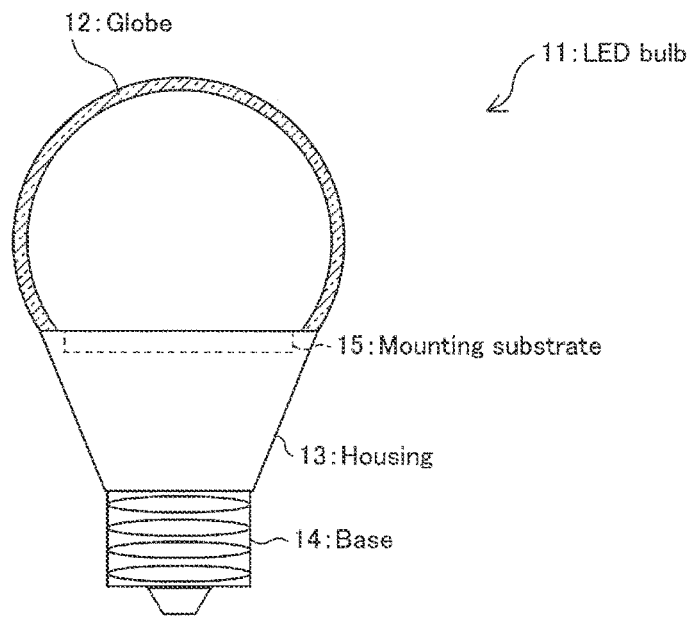
FIG. 6 is a longitudinal cross sectional view illustrating a configuration of an LED bulb including the light emission device.
Figure 7:
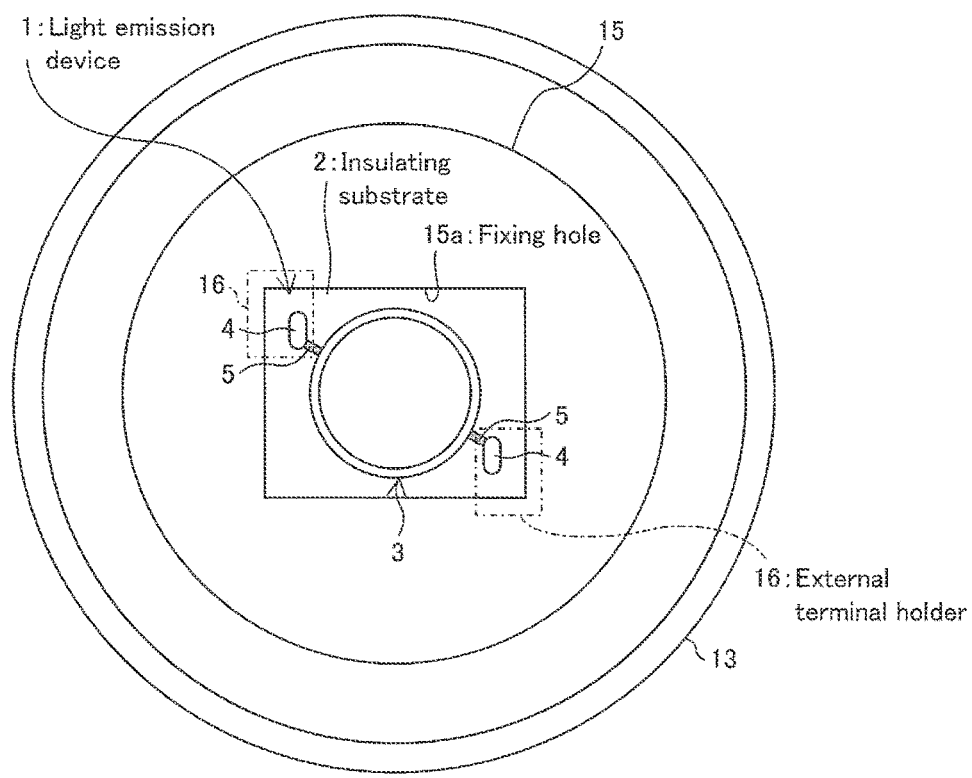
FIG. 7 is a top view illustrating a configuration of a part of the LED bulb on which part the light emission device is mounted.

The following description will discuss another embodiment of the present invention with reference to FIGS. 6 and 7.

[Entire Configuration of Light Emission Device]

FIG. 6 is a longitudinal cross sectional view illustrating a configuration of an LED bulb 11 including the light emission device 1. FIG. 7 is a top view illustrating a configuration of a part of the LED bulb 11 on which part the light emission device 1 is mounted.

As illustrated in FIG. 6, the LED bulb 11 (illumination device) includes the light emission device 1, a globe 12, a housing 13, a base 14, a mounting substrate 15, and external terminal holders 16.

The globe 12 covers and protects the light emission device 1, and transmits light from the light emission device 1. The globe 12 has a spherical shape or other shape, and is made of light-transmitting resin or glass.

The housing 13 contains a plurality of driving circuit components (not illustrated) for driving the light emission device 1 and a power source (not illustrated) for generating a direct current voltage to be supplied to the plurality of driving circuit components. The mounting substrate 15 is fixed to a part of the housing 13 on which part the light emission device 1 is mounted.

The base 14 is electrically connected with the driving circuit components, and has a screw-like structure which screws together with a socket connected with an external power source. The base 14 is fixed to an end of the housing 13 (an end toward which the housing 13 tapers).

As illustrated in FIG. 7, the mounting substrate 15 has, at a central part thereof, a quadrangular fixing hole 15a for mounting the light emission device 1. The light emission device 1 is mounted in such a manner that the insulating substrate 2 of the light emission device 1 is inserted into the fixing hole 15a and is fixed by adhesion etc. The mounting substrate 15 doubles as a heat sink, and emits heat transmitted from the light emitting section 3 of the light emission device 1 via the insulating substrate 2.

The external terminal holders 16 are each a member for supporting the land electrode 4, and are fixed in such a manner as to cover (i) a part of the surface of the insulating substrate 2 which part includes the land electrode 4 and (ii) a part of a surface of the mounting substrate 15 which part surrounds that part of the surface of the insulating substrate 2. The external terminal holders 16 support the insulating substrate 2 in such a manner that the insulating substrate 2 does not lift. Since the external terminal holders 16 are made of a conductive material, the external terminal holders 16 make electrical connection with the driving circuit components in the housing 13.

[Improvement in Reliability of LED Bulb]

The light emission device 1 including the land electrodes 4 configured as described in First Embodiment is mounted on the LED bulb 11 configured as above.

Consequently, even if the LED bulb 11 is used in a place with much vibration, it is possible to subdue or prevent a portion of a surface of the land electrodes 4 which portion contacts terminals of a connector from being damaged due to vibration. Furthermore, since the land electrodes 4 are not sulfurized, it is possible to avoid inconvenience that an amount of light of the light emission device 1 decreases due to bad electrical contact caused by deterioration of surfaces of the land electrodes 4. Therefore, it is possible to improve reliability of the LED bulb 11.

In the present embodiment, a description was made above as to an example in which the light emission device 1 is applied to the LED bulb 11. Needless to say, the light emission device 1 is applicable to other illumination device as long as the illumination device has a structure on which the light emission device 1 can be mounted.

[Additional Matters]

The present invention is not limited to the description of the embodiments above, but may be altered by a skilled person within the scope of the claims. An embodiment based on a combination of technical means appropriately modified in the scope of the claims is encompassed in the technical scope of the present invention.

As described above, the light emission device of the present invention includes: an insulating substrate; a semiconductor light emitting element mounted on the insulating substrate; and electrodes on the insulating substrate, the electrodes being for supplying power to the semiconductor light emitting element, a part of each of the electrodes which part includes at least a surface of said each electrode is made of a conductive material which is harder than Au and Ag and which has sulfurization resistance to such an extent that secures conduction of said each electrode when a current in a working current range is applied on said each electrode.

With the arrangement, a portion made of the conductive material has high hardness and is not sulfurized. Accordingly, even when the electrode vibrates while the electrode contacts the terminal of the connector to maintain electrical connection, the electrode is less likely to be damaged compared to a conventional electrode made of Au or Ag. Furthermore, the surface of the electrode does not suffer deterioration by sulfurization which would hinder practical use. Therefore, it is possible to prevent deterioration of a conductive property of the electrode.

Needless to say, a whole of the electrode may be made of the conductive material.

It is preferable to arrange the light emission device of the present invention such that Vickers hardness of the conductive material is 100 Hv or more. With the arrangement, the surface of the electrode hardly suffers the aforementioned damages.

It is preferable to arrange the light emission device of the present invention such that the electrodes are formed by printing. With the arrangement, it is possible to form the electrodes without a large facility. Furthermore, in a case where the electrode is obtained by forming a metal layer on a whole or a large area of the surface of the insulating substrate and thereafter removing most of the metal layer to leave only a small area serving as the electrode, employment of printing allows easily obtaining the electrode. This is particularly effective in a case of forming the electrode with a small area on the insulating substrate with a large area. Furthermore, since the electrode formed by printing has a sparse structure, when an alloy containing Pd etc. which is a rare metal is used as a conductive material, an amount of such a material to be used can be reduced.

The light emission device of the present invention may be arranged such that the electrodes include plural electrodes, and at least one pair of the plural pairs of electrodes are formed by printing.

It is preferable to arrange the light emission device of the present invention such that the electrodes each include a first layer on the insulating substrate and a second layer on the first layer, the second layer being made of the conductive material. With the arrangement, for example, by forming the first layer and the second layer with different conductive materials, it is possible to adjust electric resistance of the electrode as a whole and amounts of the conductive materials to be used.

It is preferable to arrange the light emission device of the present invention such that the first layer is made of Au and the second layer is made of AgPd containing 30% or more by weight but 80% or less by weight of Pd.

Alternatively, it is preferable to arrange the light emission device of the present invention such that the first layer is made of Ag and the second layer is made of AgPd containing 30% or more by weight but 80% or less by weight of Pd, the second layer covering an exposed part of the first layer.

With the arrangement, the first layer is made of Au or Ag with low electric resistance and the second layer is made of AgPd with high hardness and high corrosion resistance, so that it is possible to subdue electric resistance of the land electrode 4 as a whole and improve corrosion resistance of the electrode.

It is more preferable to arrange the light emission device of the present invention such that the second layer is made of AgPd containing 30% or more by weight but 40% or less by weight of Pd. With the arrangement, it is possible to subdue a used amount of Pd which is a rare metal, so that it is possible to reduce costs of the light emission device.

It is preferable to arrange the light emission device of the present invention such that the second layer has a thickness of 2 µm or more but 8 µm or less. With the arrangement, the electrodes have minimum strength that prevents the electrodes from being damaged, and power loss of the electrodes due to high electric resistance can be subdued to such an extent that does not hinder practical use.

It is preferable to arrange the light emission device of the present invention such that in a surface of the insulating substrate on which surface the semiconductor light emitting elements are mounted and the electrodes are provided, at least regions where the electrodes are provided are insulating. Furthermore, it is preferable to arrange the light emission device of the present invention such that at least a whole of the surface of the insulating substrate is insulating. With the arrangement, at least regions where the electrodes are directly formed can be insulating on the surface of the insulating substrate.

The illumination device of the present invention includes any one of the aforementioned light emission devices as a light source.

With the arrangement, it is possible to subdue or prevent a part of a surface of the electrodes which part contacts terminals of a connector from being damaged due to vibration. Furthermore, since at least the surface of the electrodes is not sulfurized, it is possible to avoid decrease in an amount of light of the light emission device due to bad electrical contact caused by deterioration of the surfaces of the electrodes.

INDUSTRIAL APPLICABILITY

The light emitting device of the present invention is highly reliable since it includes electrodes with improved strength and corrosion resistance. Accordingly, the light emitting device of the present invention is preferably applicable to applications for connection with an external wiring via a connector.

REFERENCE SIGNS LIST

1 Light emission device
2 Insulating substrate
3 Light emitting section
4 Land electrode (electrode)
5 Outgoing wiring
11 LED bulb (illumination device)
32 LED chip (semiconductor light emitting element)
41 First layer
42 Second layer

The invention claimed is:
1. A light emission device, comprising:
an insulating substrate;
a semiconductor light emitting element mounted on the insulating substrate; and
electrodes and outgoing wirings on the insulating substrate, the electrodes and the outgoing wirings each being for supplying power to the semiconductor light emitting element,
each of the electrodes and the outgoing wirings including a first layer on the insulating substrate, each of the electrodes being configured such that a second layer is provided on the first layer, the first layer being provided integrally with the outgoing wirings, the first layer and the outgoing wiring comprising a first conductive material with low electric resistance, the second layer comprising a second conductive material which is harder than the first layer and which has sulfurization resistance to such an extent that secures conduction of said each electrode when a current in a working current range is applied on said each electrode, wherein the second layer comprises AgPd containing 30% or more by weight but 40% or less by weight of Pd;

the second layer shielding only a part of the first layer from outside air by covering the part, the part of the first layer forming each of the electrodes, and a part of the outgoing wirings being exposed to the outside air, the part of the outgoing wirings not facing the insulating substrate.

2. The light emission device as set forth in claim 1, wherein Vickers hardness of the second conductive material is 100 Hv or more.

3. The light emission device as set forth in claim 1, wherein the electrodes are formed by printing.

4. The light emission device as set forth in claim 3, wherein the electrodes include plural electrodes, and at least one pair of the plural pairs of electrodes are formed by printing.

5. The light emission device as set forth in claim 1, wherein the first layer comprises Au.

6. The light emission device as set forth in claim 1, wherein the first layer comprises Ag.

7. The light emission device as set forth in claim 5, wherein the second layer has a thickness of 2 µm or more but 8 µm or less.

8. The light emission device as set forth in claim 1, wherein in a surface of the insulating substrate on which surface the semiconductor light emitting elements are mounted and the electrodes are provided, at least regions where the electrodes are provided are insulating.

9. The light emission device as set forth in claim 8, wherein at least a whole of the surface of the insulating substrate is insulating.

10. An illumination device, comprising, as a light source, a light emission device as set forth in claim 1.

* * * * *